United States Patent
Itoh

(10) Patent No.: US 9,230,892 B2
(45) Date of Patent: Jan. 5, 2016

(54) SEMICONDUCTOR DEVICE AND METHOD OF MANUFACTURING THE SAME

(71) Applicant: SUMITOMO BAKELITE CO., LTD., Tokyo (JP)

(72) Inventor: Shingo Itoh, Tokyo (JP)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 0 days.

(21) Appl. No.: 14/373,994

(22) PCT Filed: Mar. 12, 2013

(86) PCT No.: PCT/JP2013/001591
§ 371 (c)(1),
(2) Date: Jul. 23, 2014

(87) PCT Pub. No.: WO2013/140745
PCT Pub. Date: Sep. 26, 2013

(65) Prior Publication Data
US 2015/0028465 A1   Jan. 29, 2015

(30) Foreign Application Priority Data

Mar. 22, 2012   (JP) ................................. 2012-066161

(51) Int. Cl.
*H01L 23/49* (2006.01)
*H01L 23/495* (2006.01)
(Continued)

(52) U.S. Cl.
CPC .......... *H01L 23/49575* (2013.01); *H01L 21/56* (2013.01); *H01L 23/293* (2013.01); *H01L 23/49582* (2013.01); *H01L 24/05* (2013.01); *H01L 24/45* (2013.01); *H01L 24/48* (2013.01); *H01L 24/85* (2013.01); *H01L 23/3107* (2013.01); *H01L 23/4952* (2013.01); *H01L 24/83* (2013.01); *H01L 2224/02166* (2013.01);
(Continued)

(58) Field of Classification Search
CPC ................................. H01L 24/43; H01L 24/85
See application file for complete search history.

(56) References Cited

U.S. PATENT DOCUMENTS

| | | | | |
|---|---|---|---|---|
| 4,920,074 | A * | 4/1990 | Shimizu et al. | 29/827 |
| 2011/0104510 | A1 | 5/2011 | Uno et al. | |
| 2012/0094121 | A1 * | 4/2012 | Uno et al. | 428/389 |

FOREIGN PATENT DOCUMENTS

| JP | 62-265729 A | 11/1987 |
|---|---|---|
| JP | 2010-205974 A | 9/2010 |

(Continued)

OTHER PUBLICATIONS

International Search Report issued in PCT/JP2013/001591, dated May 7, 2013.

*Primary Examiner* — Daniel Shook
(74) *Attorney, Agent, or Firm* — Birch, Stewart, Kolasch & Birch, LLP

(57) ABSTRACT

A semiconductor device includes a semiconductor element that is mounted on a substrate, an electrode pad that contains aluminum as a main component and is provided in the semiconductor element, a copper wire that contains copper as a main component and connects a connection terminal provided on the substrate and the electrode pad, and an encapsulant resin that encapsulates the semiconductor element and the copper wire. When the semiconductor device is heated at 200° C. for 16 hours in the atmosphere, a barrier layer containing any metal selected from palladium and platinum is farmed at a junction between the copper wire and the electrode pad.

8 Claims, 2 Drawing Sheets

(51) Int. Cl.
  *H01L 23/00* (2006.01)
  *H01L 21/56* (2006.01)
  *H01L 23/29* (2006.01)
  *H01L 23/31* (2006.01)

(52) U.S. Cl.
  CPC .................. *H01L2224/04042* (2013.01); *H01L 2224/05166* (2013.01); *H01L 2224/05624* (2013.01); *H01L 2224/32245* (2013.01); *H01L 2224/45015* (2013.01); *H01L 2224/45144* (2013.01); *H01L 2224/45147* (2013.01); *H01L 2224/48091* (2013.01); *H01L 2224/48227* (2013.01); *H01L 2224/48247* (2013.01); *H01L 2224/48451* (2013.01); *H01L 2224/48465* (2013.01); *H01L 2224/48624* (2013.01); *H01L 2224/48824* (2013.01); *H01L 2224/73265* (2013.01); *H01L 2224/83101* (2013.01); *H01L 2224/83862* (2013.01); *H01L 2224/85205* (2013.01); *H01L 2224/85948* (2013.01); *H01L 2224/92247* (2013.01); *H01L 2924/181* (2013.01)

(56) References Cited

FOREIGN PATENT DOCUMENTS

| | | |
|---|---|---|
| WO | WO 2010/005086 A1 | 1/2010 |
| WO | WO 2010/150814 A1 | 12/2010 |

\* cited by examiner

SEMICONDUCTOR DEVICE AND METHOD OF MANUFACTURING THE SAME

TECHNICAL FIELD

The present invention relates to a semiconductor device and a method of manufacturing the same.

BACKGROUND ART

In recent years, a copper wire has been proposed as a bonding wire in place of a gold wire.

In Patent Document 1, there is disclosed a semiconductor device in which a copper-aluminum intermetallic compound is formed at a lunation interface between a wire and an electrode among semiconductor devices in which electrodes and leads of a semiconductor element are connected by a copper bonding wire, and led out. According to Patent Document 1, since a copper ball is brought into close contact with the electrode by forming a $CuAl_2$ layer at a junction interface between the copper ball and the aluminum electrode, the reliability is improved from the viewpoint of corrosion resistance.

RELATED DOCUMENT

Patent Document

[Patent Document 1] Japanese Unexamined Patent Publication No. 62-265729

DISCLOSURE OF THE INVENTION

However, when a junction between the copper wire and the aluminium pad is further subjected to heat treatment, Cu diffuses from the copper wire to the $CuAl_2$ layer, and an alloy layer having a higher Cu composition ratio than that of $CuAl_2$ is formed. According to the findings of the present inventors, it is apparent that the alloy layer having a higher Cu composition ratio than that of $CuAl_2$ easily suffers from corrosion caused by halogen and disconnection easily occurs.

The present invention has been made in view of the above circumstances, and an object of the present invention is to improve connection reliability under a high temperature and high humidity environment such that the growth of the alloy layer having a higher Cu composition ratio than that of $CuAl_2$ is prevented by preventing copper diffusion from the copper wire to the junction between the copper wire and the electrode pad.

According to the present invention, there is provided a semiconductor device including: a semiconductor element that is mounted on a substrate; an electrode pad that contains aluminum as a main component and is provided in the semiconductor element; a copper wire that contains copper as a main component and connects a connection terminal provided on the substrate and the electrode pad; and an encapsulant resin that encapsulates the semiconductor element and the copper wire, in which, when the semiconductor device is heated at 200° C. for 16 hours in the atmosphere, a barrier layer containing any metal selected from palladium and platinum is formed at a junction between the copper wire and the electrode pad.

According to the present invention, there is provided a semiconductor device including: a semiconductor element that is mounted on a substrate; an electrode pad that contains aluminum as a main component and is provided in the semiconductor element; a copper wire that contains copper as a main component and connects a connection terminal provided on the substrate and the electrode pad; and an encapsulant resin that encapsulates the semiconductor element and the copper wire, in which the copper wire contains any metal selected from palladium and platinum, and a content of palladium and platinum at the junction between the copper wire and the electrode pad with respect to a content of palladium and platinum at portions of the copper wire other than a junction between the copper wire and the electrode pad is more than 1.

According to the present invention, there is provided a method of manufacturing a semiconductor device including: a process of mounting a semiconductor element provided with an electrode pad containing aluminum as a main component on a substrate provided with a connection terminal; a process of connecting the connection terminal and the electrode pad with a copper wire containing copper as a main component; and a process of encapsulating, the semiconductor element and the copper wire with an encapsulant resin, in which when the semiconductor device is heated at 200° C. for 16 hours in the atmosphere after the process of encapsulating with the encapsulant resin, a barrier layer containing any metal selected from palladium and platinum is formed at the junction between the copper wire and the electrode pad.

According to the present invention, when the junction between the copper wire and the electrode pad is exposed to a high temperature and high humidity environment, the growth of the alloy layer having a higher Cu composition ratio than that of $CuAl_2$ at the junction between the copper wire and the electrode pad is prevented by providing a semiconductor device in which a barrier layer containing, any metal selected from palladium and platinum is formed, and thus, connection reliability under a high temperature and high humidity environment can be improved.

According to the present invention, since the copper wire contains any metal selected from palladium and platinum, and the content of palladium and platinum at the junction between the copper wire and the electrode pad with respect to the content of palladium and platinum at portions of the copper wire other than the junction between the copper wire and the electrode pad is more than 1, the growth of the alloy layer having a higher Cu composition ratio than that of $CuAl_2$ at the junction between the copper wire and the electrode pad is prevented, and thus, connection reliability under a high temperature and high humidity environment can be improved.

BRIEF DESCRIPTION OF THE DRAWINGS

The object described above and other objects, features, and advantages will be further clarified by preferred embodiments described below and the accompanying drawings.

DESCRIPTION OF EMBODIMENTS

Figure 1:
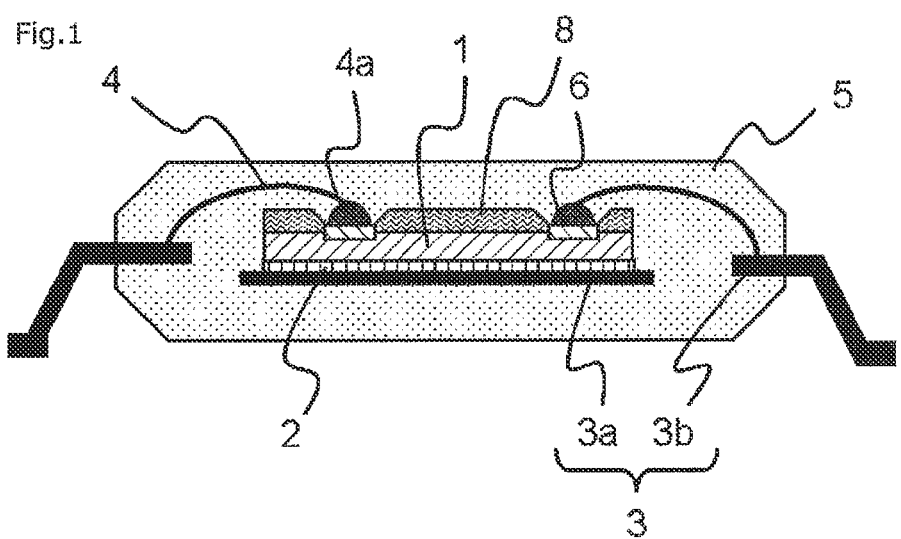
FIG. 1 is a cross-sectional view schematically illustrating a semiconductor device according to an embodiment.

Hereinafter, embodiments of the present invention will be described with reference to the drawings. Note that in all of the drawings, the same constituents are denoted by the same reference numerals, and description thereof will not be repeated appropriately.

Figure 2:
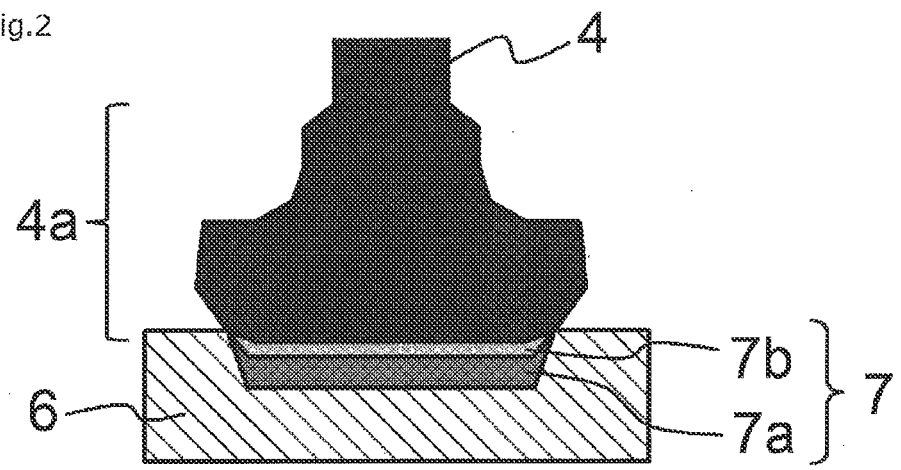
FIG. 2 is an enlarged view of a junction between a copper wire and an electrode pad in the semiconductor device according to the embodiment.

FIG. 1 is a cross-sectional view schematically illustrating a semiconductor device 10 according to an embodiment. The semiconductor device 10 includes a lead frame 3 the has a die pad 3a and an inner lead 3b, as a substrate, a semiconductor element 1 that is mounted on the die pad 3a, an electrode pad 6 that contains aluminum (Al) as a main component and is provided in the semiconductor element 1, a copper wire 4 that contains copper (Cu) as a main component and connects a connection terminal (inner lead 3b) provided on the substrate and the electrode pad 6, and an encapsulant resin 5 that encapsulates the semiconductor element 1 and the copper wire 4. When the semiconductor device 10 is heated at 200° C. for 16 hours in the atmosphere, a barrier layer 7b containing any metal selected from palladium (Pd) and platinum (Pt) is formed at a junction 7 between the copper wire 4 and the electrode pad 6 as shown in FIG. 2, more specifically, between the copper wire 4 and a CuAl alloy layer 7a in the semiconductor device 10. In addition, the copper wire contains any metal selected from palladium and platinum, and the content of palladium and platinum at the junction between the copper wire and the electrode pad with respect to the content of palladium and platinum at portions of the copper wire other than the junction between the copper wire and the electrode pad is more than 1.

The semiconductor element 1 is not particularly limited and examples thereof include an integrated circuit, a large-scale integrated circuit, and a solid-state image-sensing element.

The lead frame 3 is not particularly limited and a circuit substrate may be used in place of the lead frame 3. Specifically, lead frames or circuit substrates that are used in semiconductor devices of the related art can be used, including a dual inline package (DIP), a plastic leaded chip carrier (PLCC), a quad flat package (QFP), slow profile quad flat package (LQFP), a small outline j-lead package (SOJ), a thin small outline package (TSOP), a thin quad flat package (TQFP)), a tape carrier package (TCP), a ball, grid array (BGA), a chip size package (CSP), a quad flat non-leaded package (QFN), a small outline non-leaded package (SON), a lead frame BGA (LF-BGA), and a mold array package BGA (MAP-BGA).

The semiconductor element 1 may be a stack of plural semiconductor elements. In this case, a semiconductor element of a first layer is bonded to the die pad 3a through a cured body 2 of a die-bonding material such as a film adhesive and a thermosetting adhesive. Semiconductor elements of second and further layers can be sequentially stacked with an insulating film adhesive or the like. The electrode pad 6 is formed at an appropriate place of each layer in advance in a pre-process.

The content of Al in the electrode pad 6 is preferably equal to or more than 98% by mass with respect to the total amount of the electrode pad 6. Examples of components other than Al in the electrode pad 6 include copper (Cu), and silicon (Si). The electrode pad 6 can be prepared by forming a typical titanium-based barrier layer on the surface of copper circuit terminals of an underlayer, and then applying Al by using methods of forming an electrode pad of a semiconductor element of the related art such as deposition, sputtering, and electroless plating.

The copper wire 4 is used to electrically connect the lead frame 3 and the semiconductor element 1 that is mounted on the die pad 3a of the lead frame 3. On the surface of the copper wire 4, an oxide film is formed spontaneously or unavoidably in processes. In the present invention, the copper wire 4 also includes the wire described above that has the oxide film on the surface thereof.

The diameter of the copper wire 4 is preferably equal to or less than 30 µm, and more preferably equal to or less than 25 µm and equal to or more than 15 µm. Within this range, the ball shape at the tip of the copper wire is stabilized, so that connection reliability can be improved at the junction. In addition, the frequency of wire displacement can be reduced by the hardness of the copper wire itself.

The content of copper in the copper wire 4 is preferably 98% by mass to 99.9% by mass, more preferably 98.5% by mass to 99.7% by mass, and still more preferably 98.7% by mass to 99.3% by mass with respect to the total amount of the copper wire 4. As the copper wire 4, a copper wire containing any metal selected from Pd and Pt having a low diffusion rate onto the electrode pad is preferably used, and a copper wire which is doped with any metal selected from Pd and Pt is more preferably used. Cu in the copper wire 4 can be prevented from diffusing into the electrode pad 6 by Pd and Pt having a low diffusion rate onto the electrode pad, and thus, satisfactory connection reliability can be obtained.

A total content of Pd and Pt in the copper wire 4 is preferably equal to or more than 0.1% by mass, more preferably equal to or more than 0.3% by mass, and still more preferably equal to or more than 0.5% by mass with respect to the total amount of the copper wire 4, from the viewpoint of satisfactory high temperature storage properties. On the other hand, the total content is preferably equal to or less than 2% by mass, more preferably equal to or less than 1.5% by mass, and still more preferably equal to or less than 1% by mass to prevent the hardness of the copper wire 4 from rising and the bonding properties from being deteriorated in addition, the range of the total content of Pd and Pt in the copper wire 4 is preferably 0.1% by mass to 2% by mass, more preferably 0.3% by mass to 1.5% by mass, and still more preferably 0.5% by mass to 1% by mass, with respect to the total amount of the copper wire 4.

The copper wire 4 may contain any one of Pd and Pt. In this case, the content of Pd in the copper wire 4 is preferably 0.5% by mass to 1% by mass with respect to the total amount of the copper wire 4, or the content of Pt in the copper wire 4 is preferably 0.5% by mass to 1% by mass with respect to the total amount of the copper wire 4. Within the above-described ranges, it is possible to obtain both excellent reliability and bonding work efficiency.

Any metal selected from Pd and Pt with which the copper wire 4 is doped is presumed to be present as a solid solution in Cu.

The copper wire 4 can be provided with further improved bonding strength by doping copper as a core wire with Ba, Ca, Sr, Be, Al, or a rare-earth metal in an amount of 0.001% by mass to 0.003% by mass.

The copper wire 4 used in the semiconductor device can be obtained by casting a copper alloy doped with any metal selected from Pd and Pt in a melting furnace, extending the resulting ingot using a roll and further wire-drawing the resultant with a die, and performing post-heat treatment in which the wire is heated while the wire is continuously swept.

A copper ball 4a is formed at the tip of the copper wire 4 in the junction 7 between the copper wire 4 and the electrode pad 6.

In the semiconductor device 10, a CuAl alloy layer 7a containing Cu and Al may be formed at the junction 7 between the copper wire 4 and the electrode pad 6, or when the semiconductor device is heated at 200° C. for 16 hours in the atmosphere, the CuAl alloy layer 7a may be formed. The CuAl alloy layer 7a includes layers having different contents of Cu and Al, and Cu is a main Component contained in the copper wire 4 and Ails a main component contained in the electrode pad 6. The CuAl alloy layer 7a is a region formed by diffusion of Al in the electrode pad 6 and Cu in the copper ball 4a by heating at the time of bonding or heat treatment after encapsulating and mainly contains Cu and Al. Here, the expression of "mainly contains Cu and Al" means that a total of the content of Cu and the content of Al is more than 50% by mass, preferably equal to or more than 80% by mass, more preferably equal to or more than 90% by mass, and still more preferably equal to or more than 95% by mass, with respect to the total amount of the CuAl alloy layer 7a.

Specifically, the CuAl alloy layer 7a includes a $CuAl_2$ layer, and a layer in which the content of Cu is higher than in the $CuAl_2$ layer. In the CuAl alloy layer 7a, the ratio of the $CuAl_2$ layer occupying in the CuAl alloy layer 7a is preferably higher than that of the layer in which the content of Cu is higher than in the $CuAl_2$ layer. For example, the thickness of the CuAl alloy layer 7a is 0.2 μm to 5 μm.

The barrier layer 7b is a layer containing any metal selected from Pd and Pt and may further contain Cu. Specifically, the mass ratio of Pd and Pt in the barrier layer 7b is preferably 1.1 time to 2 times the mass ratio of Pd and Pt in the copper wire 4, and more preferably 1.2 times to 1.8 time the mass ratio of Pd and Pt in the copper wire.

The barrier layer 7b is formed at the junction 7 between the copper wire 4 and the electrode pad 6 as follows.

When the junction 7 between the copper wire 4 and the electrode pad 6 is subjected to heat treatment, Cu having a high diffusion rate in the copper wire 4 diffuses into the electrode pad 6. On the other hand, any metal selected from Pd and Pt having a low diffusion rate in the copper wire 4 remains above the CuAl alloy layer 7a, is gradually concentrated, and then, forms the barrier layer 7b.

Accordingly, Cu in the copper wire 4 can be prevented from diffusing into the electrode pad 6. In addition, Cu in the copper wire can be prevented from further diffusing into the CuAl alloy layer 7a, and thus, the growth of the layer in which the content of Cu is higher than in the $CuAl_2$ layer can be reduced in the CuAl alloy layer 7a. Further, it is possible to reduce disconnection resulting from corrosion of the layer in which the content of Cu is higher than in the $CuAl_2$ layer by halogen generated from the encapsulant resin 5.

When the semiconductor device 10 is heated at 200° C. for 16 hours in the atmosphere, the barrier layer 7b may be formed between the CuAl alloy layer 7a and the copper wire 4, or the barrier layer 7b may be formed in the semiconductor device 10 in advance.

The detailed reasons why the barrier layer 7b is formed are not clear, but are presumed as follows.

One reason which can be considered is that the amount of Pd and Pt remaining near the junction 7 after the copper wire 4 and the electrode pad 6 are bonded can be increased by increasing the concentrations of Pd and Pt having a low diffusion rate in the copper wire 4, and thus, the barrier layer 7b is easily formed; another reason which can be considered is that, by setting the elastic modulus of the encapsulant resin 5 to be equal to or more than 500 MPa and equal to or less than 15000 MPa at 175° C., the movement of the copper wire 4 can be appropriately restricted at the time of encapsulating or after encapsulating while stress imparted to the interface between the copper wire 4 and the electrode pad 6 is reduced, and thus, formation of the barrier layer becomes easier by preventing fracture caused by the stress at the junction; or the combination thereof can be considered.

The thickness of the barrier layer 7b is preferably 0.01 μm to 3 μm, and more preferably 0.05 μm to 2 μm.

The junction 7 preferably has a flat bottom surface at the interface with the electrode pad 6.

In addition, in the semiconductor device 10, the content of Pd and Pt at the junction 7 is higher than the content of Pd and Pt at portions of the copper wire 4 other than the junction 7. Specifically, the content of Pd and Pt at the junction 7 between the copper wire 4 and the electrode pad 6 with respect to the content of Pd and Pt at portions of the copper wire 4 other than the junction 7 between the copper wire 4 and the electrode pad 6 is preferably more than 1, and more preferably equal to or more than 1.3 from the viewpoint of high temperature storage properties. The "content of Pd and Pt at the junction 7" refers a content of Pd and Pt at any region of the junction 7, and more preferably a content of Pd and Pt near the interface between the copper wire 4 and the electrode pad 6.

As a method of having a higher content of Pd and Pt at the junction 7 than the content of Pd and Pt at portions of the copper wire 4 other than the junction 7, for example, a method of using the copper wire 4 having high concentrations of Pd and Pt, and a method of using the encapsulant resin whose elastic modulus is equal to or more than 500 MPa and equal to or less than 15000 MPa at 175° C. can be used. The detail of the mechanism is not clear, but since Pd and Pt have a low diffusion rate into the electrode pad 6, it can be considered that Pd and Pt diffusing from the copper wire 4 into the electrode pad 6 easily remain at the junction 7 after the copper wire 4 and the electrode pad 6 are bonded. In addition, since the movement of the copper wire 4 can be appropriately restricted at the time of encapsulating or after encapsulating with the encapsulant resin 5 having the aforementioned elastic modulus while stress imparted to the interface between the copper wire 4 and the electrode pad 6 is reduced, it can be considered that the content of Pd and Pt can be increased by preventing fracture caused by the stress of the junction.

The encapsulant resin 5 is preferably a cured body of a curable resin and specifically, more preferably resin obtained by curing an epoxy resin composition containing (A) an epoxy resin and (B) a curing agent.

The elastic modulus of the encapsulant resin 5 at 175° C. is preferably equal to or more than 500 MPa and equal to or less than 15000 MPa, and more preferably equal to or more than 800 MPa and equal to or less than 5000 MPa. Therefore, since the movement of the copper wire 4 can be appropriately restricted while stress imparted to the interface between the copper wire 4 and the electrode pad 6 is reduced, the barrier layer is more easily formed and thus, high temperature storage properties can be improved.

(A) The epoxy resin includes monomers, oligomers, and polymers having two or more epoxy groups in one molecule. The molecular weight and molecular structure thereof are not particularly limited. Examples thereof include bisphenol epoxy resins such as biphenyl epoxy resins, bisphenol A epoxy resins, bisphenol F epoxy resins, and tetramethyl bisphenol F epoxy resins, and stilbene epoxy resins; novolak epoxy resins such as phenol novolak epoxy resins and cresol novolak epoxy resins; polyfunctional epoxy resins such as triphenolmethane epoxy resins and alkyl-modified triphenolmethane epoxy resins; aralkyl epoxy resins such as phenolaralkyl epoxy resins having a phenylene structure, and phenolaralkyl epoxy resins having a biphenylene structure; naphthol epoxy resins such as dihydroxynaphthalene epoxy resins, and an epoxy resin that is obtained by glycidyl etherifying a dihydroxynaphthalene dimer; epoxy resins having a triazine nucleus such as triglycidyl isocyanurate and monoallyl diglycidyl isocyanurate; and phenol epoxy resins modified with bridged cyclic hydrocarbon compounds such as phenol epoxy resin modified with dicyclopentadiene. These may be used singly or in combination, of two or more.

Among these, the following epoxy resins preferably exhibit crystallinity: bisphenol epoxy resins such as biphenyl epoxy resins, bisphenol A epoxy resins, bisphenol F epoxy resins, and tetramethyl bisphenol F epoxy resins, and stilbene epoxy resins.

As the epoxy resin (A), at least one epoxy resin selected from the group consisting of an epoxy resin represented by the following formula (1), an epoxy resin represented by the following formula (2) and an epoxy resin represented by the following formula (3) can be preferably used.

[Chem. 1]

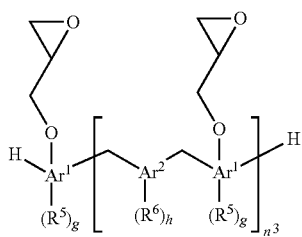

(1)

[In the formula (1), $Ar^1$ represents a phenylene group or a naphthylene group, each binding position of the glycidyl ether groups may be any one of α-position and β-position when $Ar^1$ is the naphthylene group, $Ar^2$ represents any one of a phenylene group, a biphenylene group, and a naphthylene group, $R^5$ and $R^6$ each independently represents a hydrocarbon group having 1 to 10 carbon atoms, g is an integer of 0 to 5, h is an integer of 0 to 8, $n^3$ represents polymerization degree, and the average value of $n^3$ is 1 to 3.]

[Chem. 2]

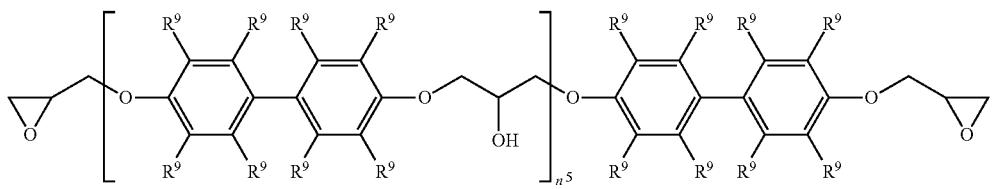

(2)

[In the formula (2), a plurality of $R^9$ each independently represents a hydrogen atom or a hydrocarbon group having 1 to 4 carbon atoms, $n^5$ represents polymerization degree, and the average value of $n^5$ is 0 to 4.]

[Chem. 3]

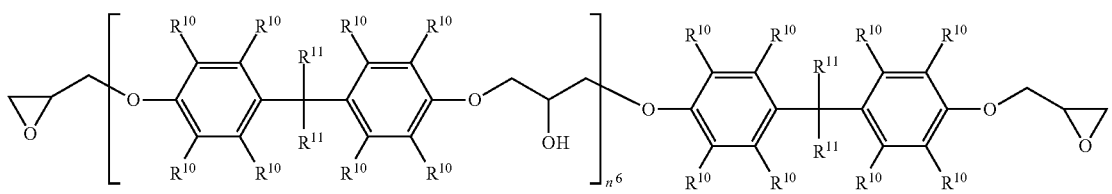

(3)

[In the formula (3), a plurality of $R^{10}$ and $R^{11}$ each independently represents a hydrogen atom or a hydrocarbon group having 1 to 4 carbon atoms, $n^6$ represents polymerization degree, and the average value of $n^6$ is 0 to 4.]

The content of (A) the epoxy resin is preferably equal to or more than 3% by mass, more preferably equal to or more than 5% by mass, and still more preferably equal to or more than 8% by mass with respect to the total amount of the epoxy resin composition. Accordingly, there is less concern that wire breakage caused by viscosity increase may be caused. Further, the content of the epoxy resin is preferably equal to or less than 18% by mass, more preferably equal to or less than 13% by mass, and still more preferably equal to or less than 11% by mass, with respect to the total amount of the epoxy resin composition. Accordingly, there is less concern that deterioration in the moisture resistance reliability caused by a water absorption ratio increase may be caused.

For example, (B) the curing agent can be roughly classified into three types: a polyaddition type curing agent; a catalyst type curing agent; and a condensation type curing agent.

Examples of the polyaddition type curing agent include aliphatic polyamines such as diethylenetriamine (DETA), triethylenetetramine (TETA), and meta-xylylene diamine (MXDA); and aromatic polyamines such as diaminodiphenyl methane (DDM) m-phenylenediamine (MPDA) and diaminodiphenylsulfone (DDS); as well as polyamine compounds such as dicyandiamide (DICY), and organic acid dihydrazide; acid anhydrides including alicyclic acid anhydrides such as hexahydrophthalic anhydride (HHPA) and methyltetrahydrophthalic anhydride (MTHPA), and aromatic acid anhydrides such as trimellitic anhydride (TMA), pyromellitic dianhydride (PMDA), and benzophenone-tetracarboxylic acid (BTDA); phenol resin-based curing agents such as novolac type phenol resins and polyvinylphenol; polymercaptan compounds such as polysulfide, thioester, and thioether; isocyanate compounds such as isocyanate prepolymers, and blocked isocyanates; and organic acids such as polyester resins containing a carboxylic acid.

Examples of the catalyst type curing agent include tertiary amine compounds such as benzyldimethylamine (BDMA), and 2,4,6-trisdimethylaminomethylphenol (DMP-30); imidazole compounds such as 2-methylimidazole, and 2-ethyl- 4-methylimidazole (EMI24); and Lewis acids such as $BF_3$ complexes.

Examples of the condensation type curing agent include resol phenol resins; urea resins such as urea resins containing a methylol group; and melamine resins such as melamine resins containing a methylol group.

Among them, the phenol resin-based curing agents are preferred from the viewpoint of the balance among flame resistance, moisture resistance, electric properties, curability, storage stability and the like. Examples of the phenol resin-based curing agent include monomers, oligomers, and polymers in general having two or more phenolic hydroxyl groups in one molecule, and the molecular weight and molecular structure thereof are particularly not limited. Examples thereof include novolac type epoxy resins such as phenol novolac resins, cresol novolac resins, and bisphenol novolac resins; polyfunctional phenol resins such as triphenol methane type phenol resins; modified phenol resins such as terpene-modified phenol resins and dicyclopentadiene-modified phenol resins; aralkyl type resins such as phenol aralkyl resins having any one selected from a phenylene skeleton and a biphenylene skeleton and naphthol aralkyl resins having any one selected from a phenylene skeleton and a biphenylene skeleton; and bisphenol compounds such as bisphenol A and bisphenol F. These may be used singly or in combination of two or more.

As (B) the curing agent, at least one curing agent selected from the group consisting of a compound represented by the following formula (4) can be preferably used.

[Chem. 4]

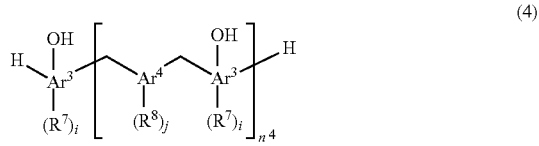

(4)

[In the formula (4), $Ar^3$ represents a phenylene group or a naphthylene group, each binding position of the hydroxyl groups may be any one of α-position and β-position when $Ar^3$ is the naphthylene group, $Ar^4$ represents any one of a phenylene group, a biphenylene group, and a naphthylene group, $R^7$ and $R^8$ each independently represents a hydrocarbon group having 1 to 10 carbon atoms, i is an integer of 0 to 5, j is an integer of 0 to 8, $n^4$ represents polymerization degree, and the average value of $n^4$ is 1 to 3.]

The content of (B) the curing agent is preferably equal to or more than 2% by mass, more preferably equal to or more than 3% by mass, and still more preferably equal to or more than 6% by mass in the epoxy resin composition. Thus, it is possible to obtain sufficient fluidity. In addition, the content of (B) the curing agent is preferably equal to or less than 15% by mass, more preferably equal to or less than 11% by mass, and still more preferably equal to or less than 8% by mass in the epoxy resin composition. Thus, there is less concern that deterioration in the moisture resistance reliability caused by a water absorption ratio increase may be caused.

Further, when phenol resin-based curing agent is used as (B) the curing agent, the blend ratio of the epoxy resin to the phenol resin-based curing agent is preferably an equivalent ratio of the number of the epoxy groups (EP) of the overall epoxy resin to the number of the phenolic hydroxyl groups (OH) of the overall phenol resin-based curing agent, (EP)/(OH), of 0.8 to 1.3. When the equivalent, ratio is within the above range, there is less concern that deterioration in curability of the epoxy resin composition or deterioration in physical properties of the cured resin product may be caused.

In addition, the epoxy resin composition forming the encapsulant resin 5 may contain (C) a filler, and (D) a neutralizing agent, and (E) a curing accelerator, as required.

As such (C) a filler, materials generally used in epoxy resin compositions for encapsulating semiconductors can be used. Examples thereof include inorganic fillers such as fused spherical silica, pulverized fused silica, crystalline silica, talc, alumina, titanium white, and silicon nitride, and organic fillers such as organosilicone powder, and polyethylene powder. Among these, fused spherical silica is particularly preferable. These fillers may be used singly or in combination of two or more. In addition, the shape of (C) the filler is preferably as close to spherical as possible and the particle diameter distribution thereof is preferably broad, whereby an increase in the melt viscosity of the epoxy resin composition is prevented and the content of the filler is increased. The filler may be subjected to surface treatment with a coupling agent. Further, as required, the filler may be subjected to a treatment with an epoxy resin or a phenol resin in advance. Examples of the treatment method include, a method of mixing in a solvent and then removing the solvent, and a method of directly adding to the filler and then mixing with a blending machine.

The content of (C) the filler is preferably equal to or more than 65% by mass, more preferably equal to or more than 75% by mass, and still more preferably equal to or more than 80% by mass with respect to the total amount of the epoxy resin composition from the viewpoint of the filling properties of the epoxy resin composition and the reliability of the semiconductor device. Since low hygroscopicity and low thermal expandability can be obtained, there is less concern of moisture resistance reliability being insufficient. In addition, considering moldability, the content of (C) the filler is preferably equal to or less than 93% by mass, more preferably equal to or less than 91% by mass, and still more preferably equal to or less than 86% by mass, with respect to the total amount of the epoxy resin composition. Thus, there is less concern of the occurrence of deterioration in fluidity causing defective filling upon molding, and the like, and inconveniences such as wire displacement in semiconductor devices caused by viscosity increase.

(D) The neutralizing agent can be used for neutralizing acid corrosive gas generated from heating of the encapsulant resin 5 that is an epoxy resin composition or a cured body thereof. Accordingly, the corrosion (oxidation deterioration) of the junction 7 between the copper wire 4 and the electrode pad 6 of the Semiconductor element 1 can be prevented. Specifically, as (D) the neutralizing agent, a basic metal salt, particularly, at least one compound selected from the group consisting of a compound containing a calcium element, a compound containing an aluminum element, and a compound containing a magnesium element can be used.

Examples of the compound containing a calcium element include calcium carbonate, calcium borate, and calcium metasilicate. Among these, calcium carbonate is preferable from the viewpoint of the content of impurities, the water resistance, and the low water absorption ratio, and precipitated calcium carbonate synthesized by a carbon dioxide gas reaction method is more preferable.

Examples of the compound containing an aluminum element include aluminum hydroxides, and boehmite. Among these, aluminum hydroxides are preferable and among the aluminum hydroxides, a low-soda aluminum hydroxide synthesized by a two-step Bayer process is more preferable.

Examples of the compound containing a magnesium element include hydrotalcite, magnesium oxide, and magnesium carbonate. Among them, from the viewpoint of the content of impurities and the low water absorption ratio, a hydrotalcite represented by the following formula (5) is preferable.

$$M_a Al_b(OH)_{2a+3b-2c}(CO_3)_c \cdot mH_2O \quad (5)$$

[In the formula (5) M represents a metal element containing at least Mg, a, b, and c are numbers satisfying conditions of 2≤a≤8, 1≤b≤3, and 0.5≤c≤2, respectively, and m is an integer of 0 or more.]

Specific examples of the hydrotalcite include $Mg_6Al_2(OH)_{16}(CO_3)\cdot mH_2O$, $Mg_3ZnAl_2(OH)_{12}(CO_3)\cdot mH_2O$, and $Mg_{4.3}Al_2(OH)_{12.6}(CO_3)\cdot mH_2O$.

The content of (D) the neutralizing agent is preferably 0.01% by mass to 10% by mass with respect to the total amount of the epoxy resin composition. When the content of (D) the neutralizing agent is set to be equal to or more than 0.01% by mass, the addition effect of the neutralizing agent can be sufficiently exhibited and the corrosion (oxidation deterioration) of the junction 7 between the copper wire 4 and the electrode pad 6 is more reliably prevented. Thus, the high temperature storage properties of the semiconductor device can be improved. In addition, when the content of (D) the neutralizing agent is set to be equal to or less than 10% by mass, the moisture absorption ratio can be decreased, and thus, there is a tendency that solder crack resistance is improved. Particularly, when calcium carbonate or hydrotalcite is used as the corrosion inhibitor, from the same viewpoint as above, the content thereof. Is preferably 0.05% by mass to 2% by mass with respect to the total amount of the epoxy resin composition.

(E) The curing accelerator may be any of those that accelerate the crosslinking reaction of the epoxy group of the epoxy resin with the curing agent (for example, the phenolic hydroxyl group of the phenol resin-based curing agent), and those generally used for epoxy resin compositions for encapsulating semiconductors can be used. Examples thereof include diazabicycloalkenes such as 1,8-diazabicyclo(5,4,0)undecene-7 and derivatives thereof; organic phosphines such as triphenylphosphine and methyldiphenylphosphine; imidazole compounds such as 2-methylimidazole; tetra-substituted phosphonium tetra-substituted borates such as tetraphenylphosphonium tetraphenylborate; the adducts of a phosphine compound with a quinone compound; and the like. These may be used singly or in combination of two or more.

The content of (E) the curing accelerator, is preferably equal to or more than 0.05% by mass, and more preferably equal to or more than 0.1% by mass with respect to the total amount of the epoxy resin composition. Thus, there is less concern that deterioration in curability may be caused. Moreover, the content of (I) the curing accelerator is preferably equal to or less than 1% by mass, and more preferably equal to or less than 0.5% by mass with respect to the total amount of the epoxy resin composition. Thus, there is less concern that deterioration in fluidity may be caused.

The epoxy resin composition for forming the encapsulant resin 5 may be further blended appropriately with various additives, as required. Examples of the additives include aluminum corrosion inhibitors such as zirconium hydroxide; inorganic ion exchangers such as bismuth oxide hydrate; coupling agents such as γ-glycidoxypropyltrimethoxysilane, 3-mercaptopropyltrimethoxysilane, and 3-aminopropyltrimethoxysilane; coloring agents such as carbon black and colcothar; low-stress components such as silicone rubber; natural waxes such as carnauba wax; synthetic waxes; higher fatty acids such as zinc stearate, and metal salts thereof; mold releasing agents such as paraffin; flame retardants such as aluminum hydroxide, magnesium hydroxide, zinc borate, zinc molybdate, and phosphazene; and antioxidants.

The epoxy resin composition for forming the encapsulant resin 5 can be prepared by appropriately adjusting the degree of dispersion, fluidity, and the like, as required, for example, by mixing each of the aforementioned components with a mixer or the like at 15° C. to 28° C., or after that, by further melt-kneading the resultant using a kneading machine such as a roll, a kneader, or a extruder, and pulverizing the resultant after cooling.

Next, an example of a method of manufacturing the semiconductor device 10 according to the embodiment will be described.

First, a part of a protective layer 8 at the uppermost layer of the semiconductor element 1 is opened to form the electrode pad 6 by a known process for manufacturing a semiconductor. The protective layer 3 is formed of an insulating layer of SiN or the like. Next, the semiconductor element 1 including the electrode pad 6 is disposed over the are pact 3a of the lead frame 3 further by a known post-process and the electrode pad 6 and the inner lead 3b are wire-bonded with the copper wire 4.

The bonding is performed in the following order. First, a copper ball 4a having a predetermined diameter (however, FIG. 2 illustrates the shape after the bonding is performed) is formed at the tip of the copper wire 4. Then, the copper ball 4a is lowered substantially orthogonal to the upper surface of the electrode pad 6 while the copper ball 4a is brought into contact with the electrode pad 6, and ultrasonic vibration is applied thereto.

Therefore, the bottom surface of the copper ball 4a is brought into contact with the electrode pad 6 to form a junction surface.

The inner lead 3b of the lead frame 3 and the semiconductor element 1 may be bonded by wire reverse bonding. In the reverse bonding, first, the ball formed at the tip of the copper wire 4 is bonded to the electrode pad 6 of the semiconductor element 1, and the copper wire 4 is cut so as to form a bump for stitch-bonding. Then, the ball formed at the tip of the wire is bonded to the metal plated inner lead 3b of the lead frame 3 so as to be stitch-bonded to the hump of the semiconductor element. In the reverse bonding, the height of the wire over the semiconductor element 1 becomes lower as compared with forward bonding, so that the height of the junction of the semiconductor element 1 can be made to be low.

Next, the semiconductor element 1, the copper wire 4, and the inner lead 3b are encapsulated by curing and molding a curable resin (for example, the above-mentioned epoxy resin composition) by molding methods of the related art such as transfer molding, compression molding, and injection molding, and post-curing is performed thereon at a temperature of about 80° C. to 200° C. for about 10 minutes to 24 hours. The post-curing is more preferably performed at 150° C. to 200° C. for 2 hours to 16 hours. Thereafter, the semiconductor element 1 encapsulated with the encapsulant resin 5 can be mounted on an electronic instrument.

In the semiconductor device 10 thus manufactured, the content of Pd and Pt at the junction 7 with respect to the content of Pd and Pt in the copper wire 4 is more than 1. In addition, when the semiconductor device 10 is heated at 200° C. for 16 hours in the atmosphere after the process of encapsulating the semiconductor device with the encapsulant resin 5, the barrier layer 7b containing any metal selected from Pd and Pt is formed at the junction 7 between the copper wire 4 and the electrode pad 6. That is, in the semiconductor device 10 in which the content of Pd and Pt at the junction 7 with respect to the content of Pd and Pt in the copper wire 4 is more than 1 and the barrier layer 7b is formed, the CuAl alloy layer 7a is formed at the junction 7 by Cu diffusing preferentially from the copper ball 4a to the electrode pad 6 due to the heat of the junction 7 in the manufacturing process or while the semiconductor device is used, and also, Pt, Pd, or the both in the copper ball 4a remain above the CuAl alloy layer 7a without diffusing into the electrode pad 6. Accordingly, it is possible to prevent. Cu in the copper wire 4 from further diffusing to the CuAl alloy layer 7a and to prevent the growth of the CuAl alloy layer 7a. Therefore, according to the present invention, when high temperature and intense heat processes are adopted after bonding, or when the semiconductor device is used under a high temperature environment (for example, when the device is disposed around an engine of an automobile), high connection reliability can be maintained.

Embodiments of the present invention are described above with reference to drawings. These are examples of the present invention. Various configurations besides the above may be adopted.

For example, the present invention relates to the semiconductor device including a semiconductor element that is mounted on a substrate, an electrode pad that contains aluminum as a main component and is provided in the semiconductor element, a copper wire that contains copper as a main component and connects a connection terminal provided on the substrate and the electrode pad, and an encapsulant resin that encapsulates the semiconductor element and the copper wire, in which a total content of palladium and platinum in the copper wire is equal to or more than 0.1% by mass and equal to or less than 2% by mass with respect to the total amount of the copper wire.

EXAMPLES

Hereinafter, the present invention will be described in detail based on examples and comparative examples, but the present invention is not limited to the following examples.

Preparation Examples 1 to 5

Each component shown in Table 1 was mixed with a mixer at 15° C. to 28° C., and then, rolled and kneaded at 70° C. to 100° C. After cooling, the resultant was pulverized, to obtain an epoxy resin composition. Here, the detail of each component in Table 1 is as follows. Further, the unit in Table 1 is % by mass.

<(A) Epoxy Resin>
Epoxy resin-OCN: EOCN-1020-55, manufactured by Nippon Kayaku. Co., Ltd, epoxy equivalent: 200
Brominated epoxy: EPICLON 152-S, manufactured by SIC Corporation, epoxy equivalent: 359
Epoxy resin-2: NC3000P, manufactured by Nippon Kayaku Co., Ltd., epoxy equivalent: 276
Epoxy resin-3: YX4000K, manufactured by Mitsubishi Chemical Corporation, epoxy equivalent: 185
<(B) Curing Agent>
Curing agent-PN: PR-HF-3, manufactured by Sumitomo Bakelite Co., Ltd., hydroxyl group equivalent: 105
<(C) Filler>
Fused spherical silica: FB-820, manufactured by DENKI KAGAKU KOGYO KABUSHIKI KAISHA, average particle diameter: 26.5 µm, containing equal to or less than 1% by mass of particles having a diameter equal to or more than 105 µm
<(D) Neutralizing Agent>
Hydrotalcite: DHT-4A (registered trademark) (Hydrotalcite in which a is 4.3, b is 2, and a is 1 in the above formula (5)), manufactured by Kyowa Chemical Industry Co., Ltd.
<(E) Curing Accelerator>
Triphenyl phosphine: TPP, manufactured by HOKKO CHEMICAL INDUSTRY CO., LTD.
<Other Components>
Coupling agent: γ-glycidoxypropyl trimethoxysilane
Coloring agent: carbon black
Mold releasing agent: carnauba wax.

TABLE 1

| EMC | Preparation Example 1 | Preparation Example 2 | Preparation Example 3 | Preparation Example 4 | Preparation Example 5 |
|---|---|---|---|---|---|
| Epoxy resin-OCN | 9.18 | 7.49 | 5.79 | 4.09 | |
| Brominated epoxy | | 2.00 | 4.00 | 6.00 | |
| Epoxy resin-2 | | | | | 4.75 |
| Epoxy resin-3 | | | | | 4.75 |
| Curing agent-PN | 4.82 | 4.51 | 4.21 | 3.91 | 4.50 |
| Filler | 84.95 | 84.95 | 84.95 | 84.95 | 84.95 |
| Neutralizing Agent | 0.05 | 0.05 | 0.05 | 0.05 | 0.05 |
| Curing Accelerator | 0.10 | 0.10 | 0.10 | 0.10 | 0.10 |
| Coloring agent | 0.30 | 0.30 | 0.30 | 0.30 | 0.30 |
| Coupling agent | 0.20 | 0.20 | 0.20 | 0.20 | 0.20 |
| Mold releasing agent | 0.40 | 0.40 | 0.40 | 0.40 | 0.40 |
| Total | 100.00 | 100.00 | 100.00 | 100.00 | 100.00 |
| SF (cm) | 108 | 106 | 102 | 101 | 127 |
| GT (sec) | 35 | 34 | 31 | 31 | 43 |
| Impurities-Na (ppm) | 1 | 1 | 2 | 2 | 2 |
| Impurities-Cl (ppm) | 17 | 20 | 15 | 18 | 17 |

TABLE 1-continued

| EMC | Preparation Example 1 | Preparation Example 2 | Preparation Example 3 | Preparation Example 4 | Preparation Example 5 |
|---|---|---|---|---|---|
| Impurities-Br (ppm) | 0 | 12 | 28 | 43 | 0 |
| Elastic modulus (Mpa, 175° C.) | 2230 | 2250 | 2280 | 2300 | 1440 |

The physical properties of the epoxy resin compositions obtained in Preparation Examples 1 to 5 were measured by the following methods. The results are shown in Table 1.

<Spiral Flow (SF)>

Using a low-pressure transfer molding machine ("KTS-15", manufactured by Kohtaki Precision Machine Co., Ltd.), each of the epoxy resin (=positions of Preparation Examples 1 to 4 was injected into a mold for spiral flow measurement in accordance with EMMI-1-66 so as to measure a flow length (unit: cm) under conditions of a mold temperature of 175° C., an injection pressure of 6.9 MPa, and a curing time of 120 seconds.

<Gel Time (GT)>

Each of the epoxy resin compositions of Preparation Examples 1 to 4 was fused on a hot plate heated to 175° C., and then, the time (second) that was required until the epoxy resin composition was cured was measured while the epoxy resin composition was kneaded with a spatula.

<Impurity Amount Measurement>

Using a low-pressure transfer molding machine ("KTS-15" manufactured by Kohtaki Precision Machine Co., Ltd.), a test piece having a size of 50 mm$\phi$×3 mm was molded under conditions of a mold temperature of 175° C., an injection pressure of 7.5 MPa and a curing time of 2 minutes. The test piece was finely pulverized after post-cure conducted at 175° C. for 8 hours, and 50 mL of distilled water was added to 5 g of the pulverized product. The resultant was placed in a Teflon (registered trademark)-lined vessel and was subjected to a treatment at 125° C. for 20 hours. After the treatment, the supernatant liquid was quantified by ion chromatography.

Examples 1 to 11 and Comparative Examples 1 to 6

A test element group (TEG) chip (3.5 mm×3.5 mm) including aluminum electrode pads (aluminum pads having an Al purity of 99.9% by mass and a thickness of 1 μm) was bonded to a die pad of a 352-pin EGA (a substrate having a thickness of 0.56 mm and being a bismaleimide triazine resin/glass cloth substrate, and a package having a size of 30 mm×30 mm and a thickness of 1.17 mm), and the aluminum electrode pads of the TEC chip and the electrode pads of the substrate were wire-bonded with copper wires shown in Tables 2 and 3 at a wire pitch of 80 μm in a daisy-chain connection. These were encapsulated with any of the epoxy resin compositions of Preparation Examples 1 to 5 shown in Tables 2 and 3, and molded with a low-pressure transfer molding machine ("Y Series", manufactured by IOWA Corp.) under conditions of a mold temperature of 175° C., an injection pressure of 6.9 MPa, and a curing time of 2 minutes. Thus, 352-pin BGA packages were prepared. The packages were post-cured under conditions of 175° C. and 4 hours so as to obtain semiconductor devices.

In Tables 2 and 3, the detail of the copper wires is as follows.

Pd doping 1: copper wire (diameter of 25 μm) having a copper purity of 98.99% by mass and a content of Pd of 1% by mass Pd doping 2: copper wire (diameter of 25 μm) having a copper purity of 99.49% by mass and a content of Pd of 0.5% by mass Pt doping: copper wire (diameter of 25 μm) having a copper purity of 98.99% by mass and a content of Pt of 1% by mass Bare: copper wire (diameter of 25 μm) having a copper purity of 99.99% by mass containing neither Pd nor Pt Pd coating: copper wire (diameter of 25 μm) having a copper purity of 99.99% by mass whose surface is coated with Pd in a thickness of 50 nm <TEM Analysis>

The structure of the junction between the copper wire and the electrode pad in each of the semiconductor devices of Examples 1 to 11 and Comparative Examples 1 to 6 was analyzed using a transmission electron microscope (TEM).

It was confirmed that the CuAl alloy layer formed of only the $CuAl_2$ layer having a thickness of 0.3 μm was formed between the copper wire and the aluminum pad in each of the semiconductor devices of Examples 1 to 11 and Comparative Examples 1 to 6.

It could not be confirmed whether the barrier layer was formed between the copper wire and the aluminum pad in each of the semiconductor devices of Examples 1 to 11 and Comparative Examples 1 to 6, but when element analysis using the transmission electron microscope (TEM) was performed, it was confirmed that the mass ratio of Pd and Pt between the copper wire and the CuAl alloy layer was 1.02 times to 1.08 times higher than the mass ratio of Pd and Pt in the copper wire in Examples 1 to 11.

When each of the semiconductor devices of Examples 1 to 11 and Comparative Examples 1 to 6 was heated at 200° C. for 16 hours in the atmosphere, and the structure of the junction between the copper wire and the electrode pad was analyzed using TEM, it was confirmed that the barrier layer having a thickness of 0.05 μm to 0.2 μm and formed of Cu/Pd was formed between the $CuAl_2$ layer having a thickness of 0.3 μm and the copper wire in each of the semiconductor devices of Examples 1 to 6, and 11. In the element analysis using TEM, it was confirmed that the mass ratio of Pd in the barrier layer was 1.2 times to 1.3 times higher than the mass ratio of Pd in the copper wire.

It was confirmed that the barrier layer having a thickness of 0.1 μm to 0.2 μm and formed of Cu/Pt was formed between the $CuAl_2$ layer having a thickness of 0.3 μm and the copper wire in each of the semiconductor devices of Examples 7 to 10. In the element analysis using TEM, it was confirmed that the mass ratio of Pt in the barrier layer was 1.2 times to 1.4 times higher than the mass ratio of Pt in the copper wire.

In each of the semiconductor devices of Comparative Examples 1 to 6, it was confirmed that the thickness of the $CuAl_2$ layer formed between the copper wire and the aluminum pad was 0.4 μm, and a $Cu_9Al_4$ layer having a thickness of 0.1 μm was further formed between the CuAl₂ layer and the copper wire. It was found that when the semiconductor device was heated at 200° C. for 16 hours in the atmosphere, the barrier layer was not formed only with surface coating the copper wire without doping the copper wire.

<Moisture Resistance and High Temperature Storage Properties>

An unsaturated moisture resistance test (HAST) and a high temperature storage life test (HTSL) for a semiconductor device were performed on each of the semiconductor devices of Examples 1 to 11 and Comparative Examples 1 to 6. The results are shown in Tables 2 and 3. The unit in Tables 2 and 3 is hours.

Specifically, HAST was conducted in accordance with IEC 68-2-66. The test conditions were 130° C. or 140° C., 85% RH, and 20 V of applied voltage. A defect occurrence time was evaluated.

HTSL was conducted at 175° C. and a defect occurrence time was evaluated.

Ten prepared packages were used for defect determination in HAST and HTSL and the time when a package having a resistance value after the tests exceeded 1.2 times the initial, resistance was set as a defective time.

TABLE 2

| | Example 1 | Example 2 | Example 3 | Example 4 | Example 5 | Example 6 | Example 11 | Example 7 | Example 8 | Example 9 | Example 10 |
|---|---|---|---|---|---|---|---|---|---|---|---|
| Cu wire | Pd doping 1 | Pd doping 1 | Pd doping 1 | Pd doping 1 | Pd doping 2 | Pd doping 2 | Pd doping 2 | Pt doping | Pt doping | Pt doping | Pt doping |
| Epoxy resin composition | Preparation Example 1 | Preparation Example 2 | Preparation Example 3 | Preparation Example 4 | Preparation Example 1 | Preparation Example 4 | Preparation Example 5 | Preparation Example 1 | Preparation Example 2 | Preparation Example 3 | Preparation Example 4 |
| HAST 130° C. | >1000 | >1000 | >1000 | >1000 | 960 | 400 | 1000 | >1000 | >1000 | >1000 | >1000 |
| HAST 140° C. | >1000 | >1000 | >1000 | >1000 | 870 | 300 | 940 | >1000 | >1000 | >1000 | >1000 |
| HTSL 175° C. | >4000 | >4000 | >4000 | >4000 | 3500 | 1800 | 4000 | >4000 | >4000 | >4000 | >4000 |

TABLE 3

| | Comparative Example 1 | Comparative Example 2 | Comparative Example 3 | Comparative Example 4 | Comparative Example 5 | Comparative Example 6 |
|---|---|---|---|---|---|---|
| Cu wire | Bare | Bare | Bare | Bare | Pd coating | Pd coating |
| Epoxy resin composition | Preparation Example 1 | Preparation Example 2 | Preparation Example 3 | Preparation Example 4 | Preparation Example 1 | Preparation Example 4 |
| HAST 130° C. | 880 | 480 | 80 | 40 | 900 | 50 |
| HAST 140° C. | 560 | 200 | 40 | 40 | 610 | 40 |
| HTSL 175° C. | 1344 | 672 | 168 | 168 | 1410 | 250 |

In the semiconductor devices of Examples, excellent high temperature moisture resistance and high temperature storage properties were observed, and particularly, since the copper wire in which a preferable range of the doping amount of Pd and Pt is 0.1% by mass to 2% by mass, more preferably 0.3% by mass to 1.5% by mass, and still more preferably equal to or more 0.5% by mass and equal to or less than 1% by mass was used, both stable reliability and bonding work efficiency were able to be obtained without being affected by the amount of halogen in the epoxy resin compositions for forming the encapsulant resin.

This application claims priority on Japanese Patent Application No. 2012-066161, filed Mar. 22, 2012, the content of which is incorporated herein by reference.

The invention claimed is:

1. A semiconductor device comprising:

a semiconductor element that is mounted on a substrate;

an electrode pad that contains aluminum as a main component and is provided in the semiconductor element;

a copper wire that contains copper as a main component and connects a connection terminal provided on the substrate and the electrode pad; and an encapsulant resin that encapsulates the semiconductor element and the copper wire, wherein when the semiconductor device is heated at 200° C. for 16 hours in the atmosphere, a barrier layer containing any metal selected from palladium and platinum is formed at a junction between the copper wire and the electrode pad, wherein said epoxy resin composition uses as an epoxy resin (A) at least one epoxy resin selected from a group consisting of an epoxy resin represented by the following formula (1), an epoxy resin represented by the following formula (2), and an epoxy resin represented by the following formula (3):

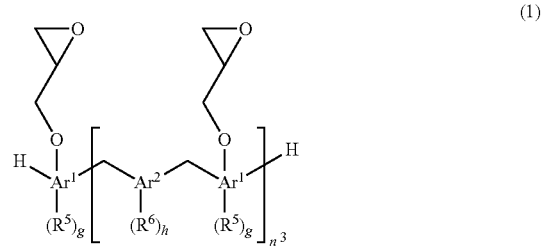

(1)

wherein in formula (1), Ar¹ represents a phenylene group or a naphthylene group, each binding position of a glycidyl ether groups may be any one of α-position and β-position when $Ar^1$ is the naphthylene group, $Ar^2$ represents any one of a phenylene group, a biphenylene group, and a naphthylene group, $R^5$ and $R^6$ each independently represents a hydrocarbon group having 1 to 10 carbon atoms, g is an integer of 0 to 5, h is an integer of 0 to 8, $n^3$ represents polymerization degree, and the average value of $n^3$ is 1 to 3;

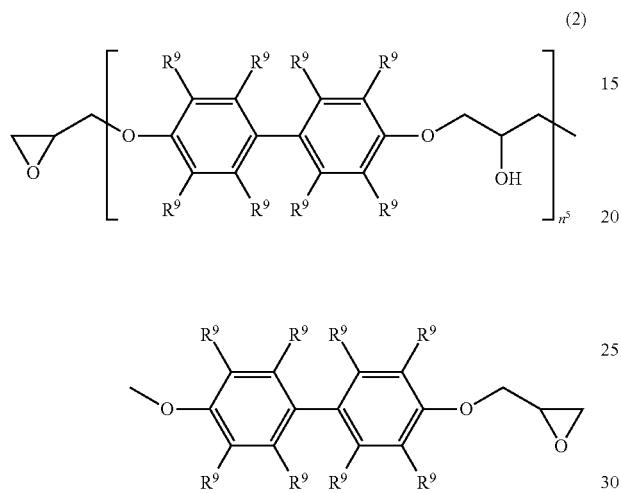

(2)

wherein in formula (2), each $R^9$ independently represents a hydrogen atom or a hydrocarbon group having 1 to 4 carbon atoms, $n^5$ represents polymerization degree, and the average value of $n^5$ is 0 to 4;

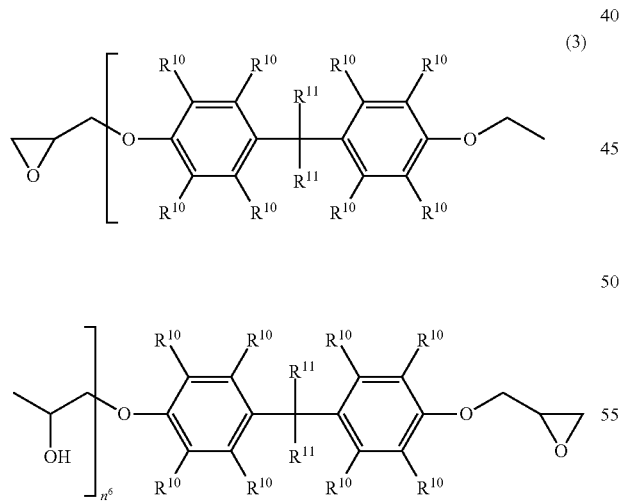

(3)

wherein in formula (3), each $R^{10}$ and $R^{11}$ independently represents a hydrogen atom or a hydrocarbon group having 1 to 4 carbon atoms, $n^6$ represents polymerization degree, and the average value of $n^6$ is 0 to 4; and wherein an elastic modulus of the encapsulant resin at 175° C. is equal to or more the 800 MPa and equal to or less than 5,000 MPa.

2. The semiconductor device according to claim 1,
wherein the thickness of the barrier layer formed when the semiconductor device is heated at 200° C. for 16 hours in the atmosphere is 0.01 μm to 3 μm.

3. The semiconductor device according to claim 1,
wherein when the semiconductor device is heated at 200° C. for 16 hours in the atmosphere, an alloy layer formed of copper and aluminum is formed between the barrier layer and the electrode pad.

4. The semiconductor device according to claim 1,
wherein a content of copper in the copper wire is 98% by mass to 99.9% by mass with respect to a total amount of the copper wire.

5. The semiconductor device according to claim 1,
wherein the substrate is a lead frame or a circuit substrate.

6. A semiconductor device comprising:
a semiconductor element that is mounted on a substrate;
an electrode pad that contains aluminum as a main component and is provided in the semiconductor element;
a copper wire that contains copper as a main component and connects a connection terminal provided on the substrate and the electrode pad; and
an encapsulant resin that encapsulates the semiconductor element and the copper wire,
wherein the copper wire contains any metal selected from palladium and platinum, and
a content of palladium and platinum at a junction between the copper wire and the electrode pad with respect to a content of palladium and platinum in the copper wire is more than 1,
wherein said epoxy resin composition uses as an epoxy resin (A) at least one epoxy resin selected from a group consisting of an epoxy resin represented by the following formula (1), an epoxy resin represented by the following formula (2), and an epoxy resin represented by the following formula (3):

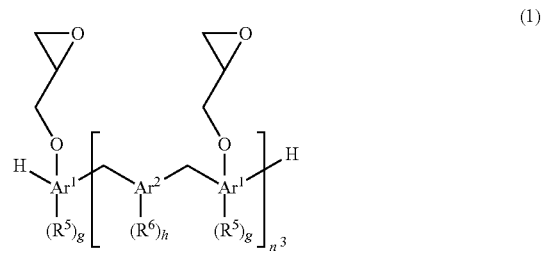

(1)

wherein in formula (1), $Ar^1$ represents a phenylene group or a naphthylene group, each binding position of a glycidyl ether groups may be any one of α-position and β-position when $Ar^1$ is the naphthylene group, $Ar^2$ represents any one of a phenylene group, a biphenylene group, and a naphthylene group, $R^5$ and $R^6$ each independently represents a hydrocarbon group having 1 to 10 carbon atoms, g is an integer of 0 to 5, h is an integer of 0 to 8, $n^3$ represents polymerization degree, and the average value of $n^3$ is 1 to 3;

wherein said epoxy resin composition uses as an epoxy resin (A) at least one epoxy resin selected from a group consisting of an epoxy resin represented by the following formula (1), an epoxy resin represented by the following formula (2), and an epoxy resin represented by the following formula (3):

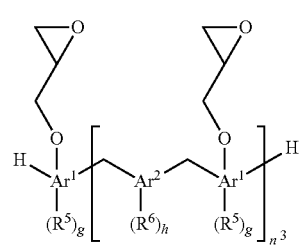

wherein in formula (1), Ar¹ represents a phenylene group or a naphthylene group, each binding position of a glycidyl ether groups may be any one of α-position and β-position when Ar¹ is the naphthylene group, Ar² represents any one of a phenylene group, a biphenylene group, and a naphthylene group, $R^5$ and $R^6$ each independently represents a hydrocarbon group having 1 to 10 carbon atoms, g is an integer of 0 to 5, h is an integer of 0 to 8, $n^3$ represents polymerization degree, and the average value of $n^3$ is 1 to 3;

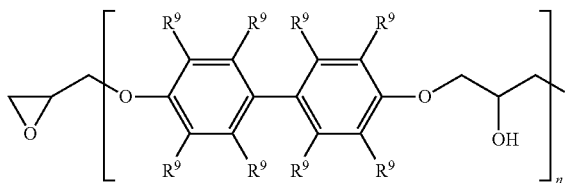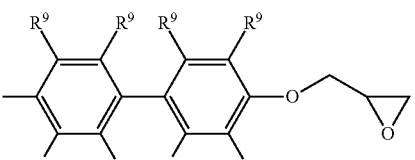

wherein in formula (2), each $R^9$ independently represents a hydrogen atom or a hydrocarbon group having 1 to 4 carbon atoms, $n^5$ represents polymerization degree, and the average value of $n^5$ is 0 to 4;

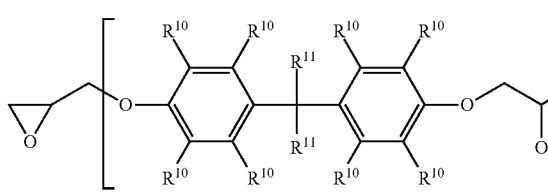

wherein in formula (3), each $R^{10}$ and $R^{11}$ independently represents a hydrogen atom or a hydrocarbon group having 1 to 4 carbon atoms, $n^6$ represents polymerization degree, and the average value of $n^6$ is 0 to 4; and wherein an elastic modulus of the encapsulant resin at 175° C. is equal to or more the 800 MPa and equal to or less than 5,000 MPa.

7. A method of manufacturing a semiconductor device comprising:
   a process of mounting a semiconductor element provided with an electrode pad containing aluminum as a main component on a substrate provided with a connection terminal;
   a process of connecting the connection terminal and the electrode pad with a copper wire containing copper as a main component; and
   a process of encapsulating the semiconductor element and the copper wire with an encapsulant resin,
   wherein when the semiconductor device is heated at 200° C. for 16 hours in the atmosphere after the process of encapsulating with the sealing resin, a barrier layer containing any metal selected from palladium and platinum is formed at the junction between the copper wire and the electrode pad,

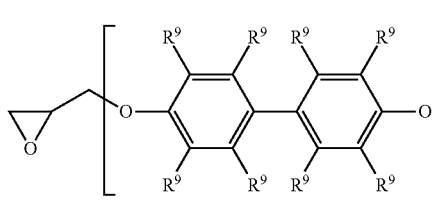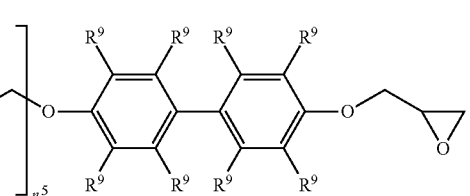

wherein in formula (2), each $R^9$ independently represents a hydrogen atom or a hydrocarbon group having 1 to 4 carbon atoms, $n^5$ represents polymerization degree, and the average value of $n^5$ is 0 to 4;

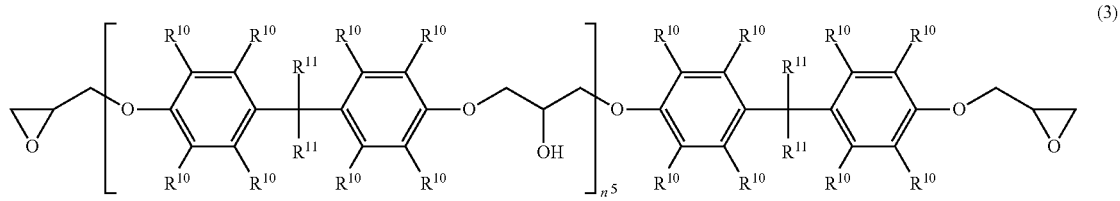

wherein in formula (3), each $R^{10}$ and $R^{11}$ independently represents a hydrogen atom or a hydrocarbon group having 1 to 4 carbon atoms, $n^6$ represents polymerization degree, and the average value of $n^6$ is 0 to 4; and wherein an elastic modulus of the encapsulant resin at 175° C. is equal to or more the 800 MPa and equal to or less than 5,000 MPa.

8. The method of manufacturing a semiconductor device according to claim 7, wherein the semiconductor device is encapsulated with an epoxy resin composition and molded in the process of encapsulating with the encapsulant resin, and then, post-cured at 150° C. to 200° C. for 2 hours to 16 hours.

* * * * *